(12) United States Patent
Chien

(10) Patent No.: US 11,440,325 B2
(45) Date of Patent: Sep. 13, 2022

(54) STRUCTURE AND METHOD FOR OPTIMIZING PROCESS OF INKJET PRINTING AND PACKAGING, AND DISPLAY SCREEN

(71) Applicant: WUHAN CHINA STAR OPTOELECTRONICS SEMICONDUCTOR DISPLAY TECHNOLOGY CO., LTD., Wuhan (CN)

(72) Inventor: Chinghung Chien, Wuhan (CN)

(*) Notice: Subject to any disclaimer, the term of this patent is extended or adjusted under 35 U.S.C. 154(b) by 289 days.

(21) Appl. No.: 16/960,331

(22) PCT Filed: Apr. 23, 2020

(86) PCT No.: PCT/CN2020/086414
§ 371 (c)(1),
(2) Date: Jul. 7, 2020

(87) PCT Pub. No.: WO2021/169013
PCT Pub. Date: Sep. 2, 2021

(65) Prior Publication Data
US 2021/0402779 A1    Dec. 30, 2021

(30) Foreign Application Priority Data

Feb. 27, 2020 (CN) .......................... 202010122904.7

(51) Int. Cl.
*B41J 2/175* (2006.01)
*H01L 27/32* (2006.01)

(52) U.S. Cl.
CPC ...... *B41J 2/17506* (2013.01); *H01L 27/3246* (2013.01)

(58) Field of Classification Search
CPC .............. H01L 27/3246; H01L 51/5246; B41J 2/17506; B41J 2/175
See application file for complete search history.

(56) References Cited

U.S. PATENT DOCUMENTS

2010/0213827 A1* 8/2010 Yoshida ............... H01L 27/3246
313/504
2014/0206119 A1* 7/2014 Kang .................. H01L 51/0012
118/712

(Continued)

FOREIGN PATENT DOCUMENTS

CN    107331681 A    11/2017
CN    208045503 U    11/2018

(Continued)

*Primary Examiner* — Kevin Quarterman

(57) ABSTRACT

A structure and a method for optimizing a process of inkjet printing and packaging, and a display screen are provided. The structure includes first dams arranged around an active display area of a substrate, the first dams include a plurality of sequentially connected first shielding sections, a plurality of drainage sections for guiding ink are arranged on an inner wall of the first shielding sections, and the drainage sections are disposed in a vertical direction. There are first intervals to allow the ink to flow between adjacent drainage sections. A structure of dams is innovatively improved in a frame design of display screens and guides the ink accurately to an ink filling area under a function of the drainage sections, therefore greatly reducing probability of the ink passing over the dams and possibility of an ink overflow.

20 Claims, 3 Drawing Sheets

(56) References Cited

U.S. PATENT DOCUMENTS

| | | | | |
|---|---|---|---|---|
| 2014/0284588 A1* | 9/2014 | Takeuchi | ............ | H01L 27/3246 257/40 |
| 2017/0005151 A1* | 1/2017 | Kim | .................... | H01L 27/3246 |
| 2017/0213881 A1* | 7/2017 | Kondo | ................ | H01L 27/3211 |
| 2018/0204891 A1* | 7/2018 | Zhao | .................... | H01L 27/3283 |
| 2018/0254303 A1 | 9/2018 | Mishima | | |
| 2019/0333973 A1* | 10/2019 | Yuan | ................... | H01L 51/0005 |

FOREIGN PATENT DOCUMENTS

| | | | |
|---|---|---|---|
| CN | 110010650 A | 7/2019 | |
| CN | 110416434 A | 11/2019 | |
| KR | 20160139669 A | 12/2016 | |
| WO | 2018196271 A1 | 11/2018 | |

* cited by examiner

STRUCTURE AND METHOD FOR OPTIMIZING PROCESS OF INKJET PRINTING AND PACKAGING, AND DISPLAY SCREEN

FIELD OF INVENTION

The present disclosure relates to the technology field of inkjet printing and packaging, and particularly related to a structure and a method for optimizing a process of inkjet printing and packaging, and a display screen.

BACKGROUND OF INVENTION

Organic light-emitting diodes (OLEDs) are a next generation of display technologies that has advantages of high contrast, wide color gamut, self-illumination, and fast response times, etc., and has particular application and innovative potential in flexible display technologies. Due to advantages of inkjet printing, such as material saving, mild processing conditions, and more uniform film formation, fabrication of OLED display screens generally adopt the inkjet printing method. In designing the inkjet printing (IJP) of the OLED display screens, ink used by the inkjet printing needs to be injected accurately into a corresponding ink filling area to ensure a smooth progress of the inkjet printing, and there is a need to prevent the ink from flowing out of an ink filling area. An occurrence of an ink overflow at a pixel unit at an edge of the OLED display screens may seriously affect product frame, and the ink overflow at a pixel unit in a middle of the OLED display screens may generally lead to a pixel shorting or other screen display problems. Therefore, regarding packaging of the above-mentioned OLED display screens, there is an urgent need to prevent a series of problems of the OLED display screens caused by the ink overflow.

Technical Problems

In order to solve the above problems, someone put forward a method to collect overflowing ink, and then evaporate ink collected, so as to realize a process of packaging. However, the method is not only complicated and costly, but also more or less affects the ink collected or other display screens in an ink filling area during an evaporation process of the ink, thus, quality of packaging is reduced. Therefore, the method above-mentioned does not fundamentally solve a problem of an ink overflow, the problem of the ink overflow still exists, and a threat of the ink overflow to the display screens still exists during a process of inkjet printing.

Therefore, for those skilled in the art, how to fundamentally reduce or even prevent an occurrence of the ink overflow during the process of inkjet printing has become an urgent technical problem to be solved all the time.

Technical Solutions

The present disclosure provides following technical solutions:

In order to solve a problem that an ink overflow cannot be avoided during an existing process of inkjet printing, the present disclosure innovatively provides a structure and a method for optimizing a process of inkjet printing and packaging, and a display screen, under a function of drainage sections, ink is accurately guided to be added to an ink filling area, therefore, probability of the ink passing over dams and possibility of the ink overflow are greatly reduced. It is especially suitable for an ink filling in an active display area near a frame of special-shaped display screens, it can fundamentally solve many problems existing in present technologies.

In a structure for optimizing a process of inkjet printing and packaging of the present disclosure, the structure includes:

first dams arranged around an active display area of a substrate, the first dams include a plurality of sequentially connected first shielding sections. And the substrate and the plurality of sequentially connected first shielding sections surround an ink filling area, and a plurality of drainage sections for guiding ink are arranged on an inner wall of the first shielding sections.

The drainage sections are disposed in a vertical direction, there are first intervals for allowing the ink to flow in between adjacent drainage sections, and the ink filling area is configured to be filled by the ink of preset colors.

In an embodiment of the present disclosure, the structure further includes buffer sections that are disposed in the ink filling area and adjacent to the first intervals, and are configured to reduce a flow rate of the ink to the ink filling area during an ink filling process. And a height of each of the buffer sections is less than a height of each of the drainage sections, and the height of each of the drainage sections is less than or equal to a height of each of the first shielding sections.

In an embodiment of the present disclosure, there is a one-to-one correspondence between the buffer sections and the first intervals, a width of each of the buffer sections is less than a width of each of the first intervals, and a number of the buffer sections is same as a number of the first intervals.

In an embodiment of the present disclosure, the structure further includes at least one second dam, the second dam is arranged around outer sides of all of the first dams, and a height of the second dam is greater than a height of each of the first dams.

In an embodiment of the present disclosure, the structure further includes at least one second dam, the second dam is arranged around outer sides of all of the first dams, and a height of the second dam is greater than a height of each of the first dams.

In an embodiment of the present disclosure, the packaging structure further includes at least one second dam, the second dam is arranged around outer sides of all of the first dams, and the height of the second dam is greater than that of the first dams.

In an embodiment of the present disclosure, the second dam is adjacent to an edge of the active display area.

In an embodiment of the present disclosure, a material of the drainage sections consists of a hydrophobic material, and/or a material of the buffer sections consists of a hydrophilic material.

In an embodiment of the present disclosure, a material of the drainage sections consists of a hydrophobic material, and/or a material of the buffer sections consists of a hydrophilic material.

In an embodiment of the present disclosure, a material of the drainage sections consists of a hydrophobic material, and/or a material of the buffer sections consists of a hydrophilic material.

In an embodiment of the present disclosure, a material of the drainage sections consists of a hydrophobic material, and/or a material of the buffer sections consists of a hydrophilic material.

In the method for optimizing a process of inkjet printing and packaging of the present disclosure, the method includes a following step:

using a plurality of drainage sections disposed in a vertical direction to guide ink to be added to an ink filling area during an ink filling process.

There are first intervals for allowing the ink to flow in between adjacent drainage sections, the plurality of the drainage sections are arranged on an inner wall of first shielding sections, and a plurality of sequentially connected first shielding sections constitute first dams. And a substrate and the plurality of the sequentially connected first shielding sections surround the ink filling area, and the first dams are arranged around an active display area of the substrate.

In an embodiment of the present disclosure, the method further includes a following step:

using buffer sections to reduce a flow rate of the ink to the ink filling area during the ink filling process.

The buffer sections are disposed in the ink filling area and adjacent to the first intervals, a height of each of the buffer sections is less than a height of each of the drainage sections, and the height of each of the drainage sections is less than or equal to a height of each of the first shielding sections.

In an embodiment of the present disclosure, the method further includes a following step:

using a second dam adjacent to an edge of the active display area to prevent the ink from flowing out of the active display area during the ink filling process.

In an embodiment of the present disclosure, the method further includes a following step:

using a second dam adjacent to an edge of the active display area to prevent the ink from flowing out of the active display area during the ink filling process.

In an embodiment of the present disclosure, the structure further includes buffer sections that are disposed in the ink filling area and adjacent to the first intervals, and are configured to reduce a flow rate of the ink to the ink filling area during an ink filling process. And a height of each of the buffer sections is less than a height of each of the drainage sections, and the height of each of the drainage sections is less than or equal to a height of each of the first shielding sections.

In an embodiment of the present disclosure, there is a one-to-one correspondence between the buffer sections and the first intervals, a width of each of the buffer sections is less than a width of each of the first intervals, and a number of the buffer sections is same as a number of the first intervals.

In an embodiment of the present disclosure, the structure further includes at least one second dam, the second dam is arranged around outer sides of all the first dams, and a height of the second dam is greater than a height of each of the first dams.

In an embodiment of the present disclosure, a material of the drainage sections consists of a hydrophobic material, and/or a material of the buffer sections consists of a hydrophilic material.

Beneficial Effects

The present disclosure innovatively improves a structure of dams in a frame design of a display screen, and accurately guides ink to an ink filling area under the function of drainage sections, the ink is accurately guided to be added to the ink filling area, therefore greatly reducing probability of the ink passing over the dams and an occurrence of an ink overflow, under a further function of buffer sections, it can avoid a risk of the ink flowing too fast, which may lead to the ink crossing the dams, therefore, the present disclosure can accurately guide the ink into a corresponding ink filling area (i.e. dams), so as to thoroughly solve many problems existing in the present technologies, furthermore, the present disclosure can significantly shorten the time to adjust a process of inkjet printing, provide more spare time for the process of inkjet printing, make the process of inkjet printing more flexible, reduce requirements for machine stability, increase inkjet printing convenience, and stabilize the fabrication of the display screens (especially OLED display screens), greatly reducing costs of inkjet printing and packaging processes.

The present disclosure is especially suitable for the packaging of special-shaped display screens with irregular shapes, such as "water drop screen", and "hole digging screen", etc., as it ensures that the ink flows into the dams accurately, that a yield of ink-jet printing is improved, and guarantee the stability of the OLED display screens, therefore, the present disclosure is suitable for widespread promotion and application.

DESCRIPTION OF DRAWINGS

For a better understanding of features and technical solutions of the present disclosure, please refer to following detailed descriptions and drawings of the present disclosure. However, the drawings are only for reference and illustration, and the drawings are not intended to limit the present disclosure.

Figure 1:
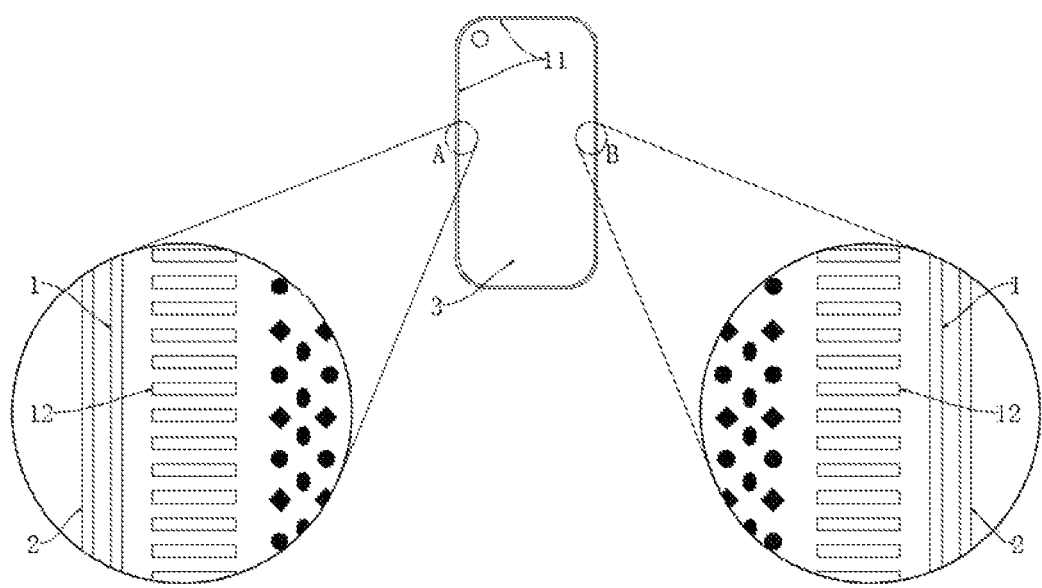
FIG. 1 is a structural schematic diagram for optimizing a process of inkjet printing and packaging in some embodiments of the present disclosure, and is an enlarged structural schematic diagram located at A and B.

In the drawings, the reference characters are: first dams 1, first shielding sections 11, drainage sections 12, buffer sections 13, a second dam 2, and a substrate 3.

DETAILED DESCRIPTION OF EMBODIMENTS

In combination with drawings of the specification, a technical solution of a structure and a method for optimizing a process of inkjet printing and packaging, and a display screen provided by each embodiment of present disclosure is described clearly and completely. Obviously, the described embodiments are only a part of the embodiment of the present disclosure, not all the embodiments. Based on the embodiments of the present disclosure, all other embodiments obtained by those skilled in the art without creative labor belong to a scope of protection of the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first", "second", and "third" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection. It can mean a mechanical connection, an electrical connection, or can communicate with each other. It can mean a direct connection, an indirect connection by an intermediate, or an inner communication or an interaction between two elements. Those skilled in the art should understand the specific meanings in the present disclosure according to specific situations.

In the present disclosure, the term "exemplary" is used to refer to "as an example, illustration or illustration". Any embodiment described as "exemplary" in the present disclosure is not necessarily interpreted to be more preferred or advantageous than other embodiments. In order to enable those skilled in the art to realize and use the present disclosure, the following description is given. In the following description, the present disclosure lists details for purposes of interpretation. It should be understood that those skilled in the art can realize the present disclosure even without using these specific details. In other examples, well-known structures and processes will not be described in detail to avoid unnecessary details that obscure the description of the present disclosure. Therefore, the present disclosure is not intended to be limited to the embodiments shown, but should be consistent with the widest range of principles and features disclosed by the present disclosure.

Embodiment 1

The embodiment discloses a structure for optimizing a process of inkjet printing and packaging. Please refer to FIG. 1, FIG. 1 is a structural schematic diagram for optimizing a process of inkjet printing and packaging in some embodiments of the present disclosure, and is an enlarged structural schematic diagram located at A and B, the position filled in the enlarged structural schematic diagram located at A and B (an inner area of the display panel) is a display area (active display area), the structure includes first dams 1 arranged around the active display area (AA) of a substrate 3, each one of the first dams 1 can be enclosed into a pixel definition layer, and ink will shrink into a groove enclosed by the first dams 1 after drying, a number of the first dams 1 can be set reasonably and wisely according to a size of a specific product and dams, in a display screen in FIG. 1, all the dams are illustrated in a schematic way, and are not a limitation of the present disclosure. More specifically, the first dams 1 include a plurality of sequentially connected first shielding sections 11, a number of the first shielding sections 11 can be set according to an actual situation of the dams, which depends on a shape of a display panel. In practice, a shape and the number of the first shielding sections 11 can be set reasonably and wisely according to the actual situation. Regarding the substrate 3 and the first shielding sections 11 surround an ink filling area, please refer to FIG. 1 while referring to FIG. 2. A plurality of drainage sections 12 for guiding the ink are arranged on an inner wall of the first shielding sections 11, the drainage sections 12 are arranged around the display panel, it can be understood that an extension direction of the drainage section 12 is perpendicular to a plane of the first dams 1, there are first intervals to allow the ink to flow between adjacent drainage sections 12, the ink can flow into the dams from the first intervals, so as to avoid a series of problems related to product frames, poor displays, or pixel shorting caused by an ink overflow. In this embodiment, N−1 first intervals can be formed between N drainage sections, the first intervals are gaps between two adjacent drainage sections, so that the ink can flow through the gaps. FIG. 3 is a structural schematic diagram of a plurality of display panels processed in batches, and is an enlarged structural schematic diagram located at A, the ink filling area is used to fill the ink of preset colors (such as R/G/B), among the preset colors, R (RED) means red, G (GREEN) means green, and B (BLUE) means blue. The present disclosure innovatively improves a structure of the dams in a frame design of the display screens, accurately guides the ink to the ink filling area under a function of the drainage sections, the ink is accurately guided to be added to the ink filling area, therefore greatly reducing probability of the ink passing over the dams and an occurrence of the ink overflow.

Figure 2:
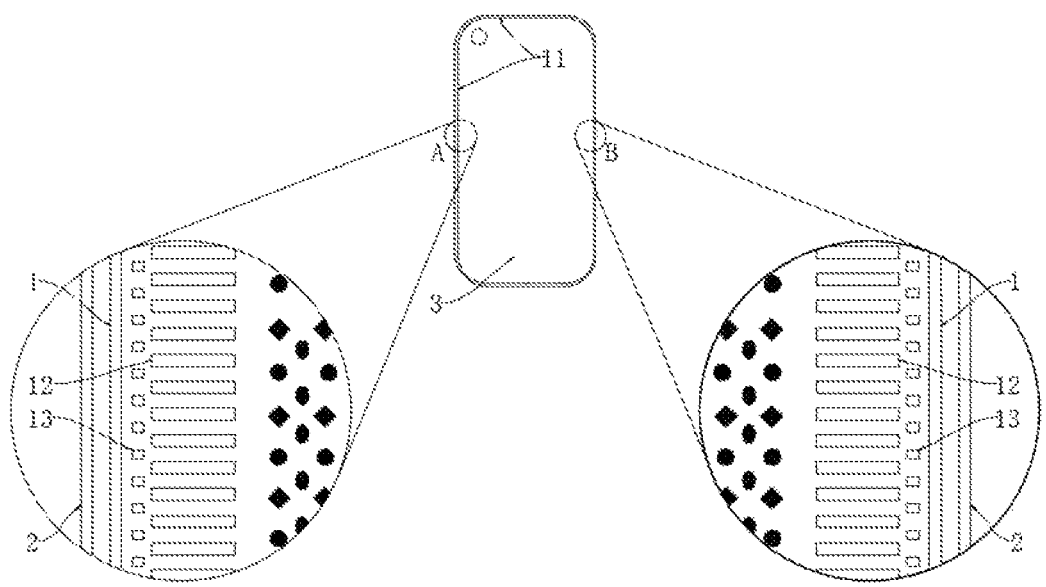
FIG. 2 is a structural schematic diagram for optimizing a process of inkjet printing and packaging in other embodiments of the present disclosure, and is an enlarged structural schematic diagram located at A and B.
Figure 3:
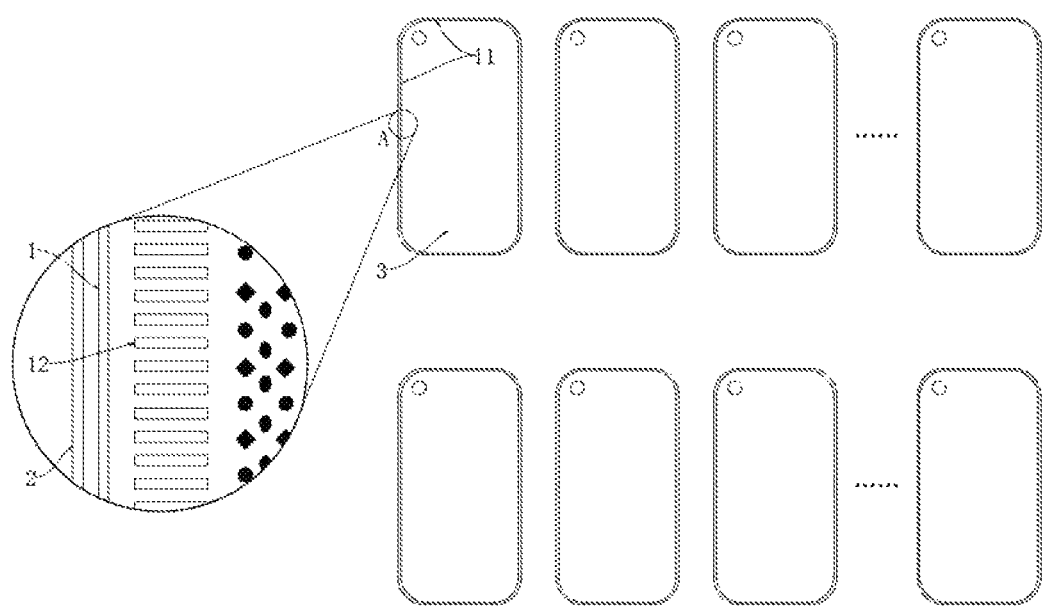
FIG. 3 is a structural schematic diagram of a plurality of display panels processed in batches, and is an enlarged structural schematic diagram located at A.

For an improved technical solution, refer to FIG. 2. FIG. 2 is a structural schematic diagram for optimizing a process of inkjet printing and packaging in other embodiments of the present disclosure, and is also an enlarged structural schematic diagram located at A and B, the structure further includes buffer sections 13 disposed in the ink filling area and adjacent to the first intervals, configured to reduce a flow rate of the ink to the ink filling area during the ink filling process, and can prevent the ink from being administered too fast, reducing or even completely preventing the occurrence of the ink overflow, so as to avoid a series of problems related to product frames, poor displays, or pixel shorting caused by the ink overflow. A height of each of the buffer sections 13 is less than a height of each of the drainage sections 12, and the height of each of the drainage sections 12 is less than or equal to a height of each of the first shielding sections 11, referring to FIG. 2, the buffer sections 13 can be a reasonable shape that prevents the ink from flowing too fast. For example, the shape may be cylindrical, and conical, etc. In this embodiment, in order to further strengthen a buffering performance, there is a one-to-one correspondence between the buffer sections 13 and the first intervals, a width of each of the buffer sections 13 is less than a width of each of the first intervals, and a number of the buffer sections 13 is same as a number of the first intervals.

For a further improved technical solution, a second dam 2 is close to an edge of the active display area. In order to improve a drainage performance and the buffering performance, a material of the drainage sections 12 consists of a hydrophobic material, and/or a material of the buffer sections 13 consists of a hydrophilic material. The "and/or" in the present disclosure is only an association relation describing an associated object indicating that there can be three kinds of relations, for example, "A and/or B" indicates that there are three kinds of situations: only A, only B, and A and B. As stated above, the material of the drainage sections 12 consists of the hydrophobic material or the material of the buffer sections 13 consists of the hydrophilic material, or, the material of the drainage sections 12 consists of the hydrophobic material and the material of the buffer sections 13 consists of the hydrophilic material. The hydrophobic material can use one or more of silicon nitride, silicon oxynitride, silicon oxide, and aluminum oxide. The solution is especially suitable for the packaging of OLED display screens. A design of above structure is mainly used for the frame design of the display screens. Under the further function of the buffer sections, it can avoid a risk of the ink flowing too fast, which may lead to the ink crossing the dams, therefore, the present disclosure can accurately guide the ink into a corresponding ink filling area (i.e. dams), so as to thoroughly solve many problems existing in the present technologies, furthermore, the present disclosure can significantly shorten the time to adjust the process of inkjet printing, provide more spare time for the process of inkjet printing, make the process of inkjet printing more flexible, reduce requirements for machine stability, increase inkjet printing process convenience, and stabilize the fabrication of the display screens (especially the OLED display screens), greatly reducing costs of the inkjet printing and packaging processes.

In some preferred embodiments, the buffer sections 13 of the present disclosure can further be designed into a "honeycomb" structure according to the situation, so as to further significantly enhance the buffering performance on the ink.

Please refer to FIG. 2, FIG. 2 is the structural schematic diagram for optimizing a process of inkjet printing and packaging in other embodiments of the present disclosure, and is an enlarged structural schematic diagram located at A and B. In order to avoid the ink overflow in case of accidents, and the structure further includes at least one second dam 2. The second dam 2 is arranged around outer sides of all of the first dams 1, and a height of the second dam 2 is greater than a height of each of the first dams 1, it can be understood that the second dam 2 is a large-sized dam around the edge of the whole display screen, so as to effectively prevent the ink flowing out of the active display area and affecting the product frame.

In addition, for the ink used in the process of inkjet printing and packaging, for those skilled in the art can choose appropriate ink wisely according to the actual situation, and the contents will not be repeated here.

Embodiment 2

Based on the same inventive concept as the above structure for optimizing the process of inkjet printing and packaging, the present disclosure provides the method for optimizing a process of inkjet printing and packaging, this method is configured to provide the process of optimizing the packaging process of inkjet printing, which is a part of the whole packaging process of the display screens.

Specifically, the method for optimizing the process of inkjet printing and packaging includes a following step: during the ink filling process, the first dams 1 include a plurality of sequentially connected first shielding sections 11, the number of the first shielding sections 11 can be set according to the actual situation of the dams, which depends on a shape of the display panel, in practice, the shape and the number of the first shielding sections 11 can be set reasonably and wisely according to the actual situation. Regarding the substrate 3 and the first shielding sections 11 surround the ink filling area, please refer to FIG. 2 while referring to FIG. 1. A plurality of the drainage sections for guiding the ink are arranged on the inner wall of the first shielding sections 11, the drainage sections 12 are arranged around the display panel, it can be understood that the extension direction of the drainage section 12 is perpendicular to the plane of the first dams 1, there are first intervals to allow the ink to flow between the adjacent drainage sections 12, the ink can flow into the dams from the first intervals, so as to avoid a series of problems related to product frames, poor displays, or pixel shorting caused by the ink overflow, in this embodiment, N-1 first intervals can be formed between N drainage sections, the first intervals are gaps between two adjacent drainage sections, so that the ink can flow through the gaps.

FIG. 3 is a structural schematic diagram of a plurality of display panels processed in batches, and is an enlarged structural schematic diagram located at A, the ink filling area is used to fill the ink of preset colors (such as R/G/B), among the preset colors, R (RED) means red, G (GREEN) means green, and B (BLUE) means blue. The present disclosure innovatively improves a structure of the dams in the frame design of the display screens, accurately guides the ink to the ink filling area under the function of the drainage sections, the ink is accurately guided to be added to the ink filling area, therefore greatly reducing probability of the ink passing over the dams and the occurrence of the ink overflow.

The method further includes a following step, the buffer sections 13 are configured to reduce a flow rate of the ink to the ink filling area during the ink filling process, and can prevent the ink from being administered too fast, reducing or even completely preventing the occurrence of the ink overflow, so as to avoid a series of problems related to product frames, poor displays, or pixel shorting caused by the ink overflow. The position and structure of the buffer sections 13 may be as illustrated in FIG. 2 or a structure that achieves the same function. FIG. 2 is the structural schematic diagram for optimizing a process of inkjet printing and packaging in other embodiments of the present disclosure, and is an enlarged structural schematic diagram located at A and B, the buffer sections 13 are disposed in the ink filling area and adjacent to the first intervals, configured to reduce the flow rate of the ink to the ink filling area during the ink filling process, and can prevent the ink from being administered too fast, reducing or even completely preventing the occurrence of the ink overflow. And the height of each of the buffer sections 13 is less than the height of each of the drainage sections 12, and the height of each of the drainage sections 12 is less than or equal to a height of each of the first shielding sections 11. Refer to FIG. 2, the buffer sections 13 of the present disclosure can further be designed into a "honeycomb" structure according to the actual situation, so as to further significantly enhance the buffering effect on the ink. Under the further function of the buffer sections, it can avoid the risk of the ink flowing too fast, which may lead to the ink crossing the dams, therefore, the present disclosure can accurately guide the ink into the corresponding ink filling area (i.e. dams), so as to thoroughly solve many problems existing in the present technologies, furthermore, the present disclosure can significantly shorten the time to adjust the process of inkjet printing, provide more spare time for the process of inkjet printing, make the process of inkjet printing more flexible, reduce requirements for machine stability, increase inkjet printing process convenience, and stabilize the fabrication of the display screens (especially the OLED display screens), greatly reducing costs of the inkjet printing and packaging processes.

Please refer to FIG. 2, FIG. 2 is a structural schematic diagram for optimizing a process of inkjet printing and packaging in other embodiments of the present disclosure, and is an enlarged structural schematic diagram located at A and B. In order to avoid the ink overflow in case of accidents, and the structure further includes at least one second dam 2. The second dam 2 is arranged around the outer sides of all of the first dams 1, and the height of the second dam 2 is greater than the height of each of the first dams 1, so as to effectively prevent the ink flowing out of the active display area and affecting the product frames.

On the basis of disclosed contents of the embodiment, other processes of inkjet printing and packaging can be selected reasonably and wisely according to needs, and the overall packaging process of the display screens (such as the OLED display screens) is no longer described in the present disclosure.

Embodiment 3

The display screens can be the OLED display screens, the OLED display screens include any structure for optimizing the process of inkjet printing and packaging according to embodiment 1 and embodiment 2, the display screens encapsulated by the present disclosure can be applied in fields of mobile phones, TVs, lighting, flexible displays, and vehicle screens, etc. In addition, the OLED display screen of the present disclosure can be a passive matrix organic light emitting diode (PMOLED) display screen or an active matrix organic light emitting diode (AMOLED) display screen, and the OLED display screen of the present disclosure can be a flexible screen or a rigid screen. The present disclosure is especially suitable for the packaging of special-shaped display screens with irregular shapes, such as "water drop screen", and "hole digging screen", etc., as it ensures that the ink flows into the dams accurately, that a yield of ink-jet printing is improved, and guarantees the stability of the OLED display screens, therefore, the present disclosure is suitable for widespread promotion and application.

The above are only the preferred embodiments of the present disclosure and are not intended to limit the present disclosure. Any modification, equivalent replacement, and simple improvement made on the essence of the present disclosure should be included in the protection scope of the present disclosure.

INDUSTRIAL APPLICABILITY

The present disclosure can accurately guide ink into a corresponding ink filling area (i.e. dams), and the present disclosure can further significantly shorten time to adjust a process of inkjet printing, provide more spare time for the process of inkjet printing, make the process of inkjet printing more flexible, reduce requirements for machine stability, increase inkjet printing convenience, and stabilize a fabrication of display screens (especially OLED display screens), greatly reducing costs of inkjet printing and packaging processes.

The present disclosure is especially suitable for the packaging of special-shaped display screens with irregular shapes, such as "water drop screen", and "hole digging screen", etc., as it ensures that the ink flows into the dams accurately, that a yield of ink-jet printing is improved, and guarantees the stability of the OLED display screens.

What is claimed is:

1. A structure for optimizing a process of inkjet printing and packaging, comprising:
   first dams (1) arranged around an active display area of a substrate (3), wherein the first dams (1) comprise a plurality of sequentially connected first shielding sections (11); and
   the substrate (3) and the plurality of sequentially connected first shielding sections (11) surround an ink filling area, and a plurality of drainage sections (12) for guiding ink are arranged on an inner wall of the first shielding sections (11);
   wherein the drainage sections (12) are disposed in a vertical direction, there are first intervals for allowing the ink to flow in between adjacent drainage sections (12), and the ink filling area is configured to be filled by the ink of preset colors.

2. The structure for optimizing the process of inkjet printing and packaging in claim 1, wherein the structure further comprises buffer sections (13) that are disposed in the ink filling area and adjacent to the first intervals, and are configured to reduce a flow rate of the ink to the ink filling area during an ink filling process; and
   a height of each of the buffer sections (13) is less than a height of each of the drainage sections (12), and the height of each of the drainage sections (12) is less than or equal to a height of each of the first shielding sections (11).

3. The structure for optimizing the process of inkjet printing and packaging in claim 2, wherein there is a one-to-one correspondence between the buffer sections (13) and the first intervals, a width of each of the buffer sections (13) is less than a width of each of the first intervals, and a number of the buffer sections (13) is same as a number of the first intervals.

4. The structure for optimizing the process of inkjet printing and packaging in claim 1, wherein the structure further comprises at least one second dam (2), the second dam (2) is arranged around outer sides of all of the first dams (1), and a height of the second dam (2) is greater than a height of each of the first dams (1).

5. The structure for optimizing the process of inkjet printing and packaging in claim 2, wherein the structure further comprises at least one second dam (2), the second dam (2) is arranged around outer sides of all of the first dams (1), and a height of the second dam (2) is greater than a height of each of the first dams (1).

6. The structure for optimizing the process of inkjet printing and packaging in claim 3, wherein the structure further comprises at least one second dam (2), the second dam (2) is arranged around outer sides of all of the first dams (1), and a height of the second dam (2) is greater than that of the first dams (1).

7. The structure for optimizing the process of inkjet printing and packaging in claim 4, wherein the second dam (2) is adjacent to an edge of the active display area.

8. The structure for optimizing the process of inkjet printing and packaging in claim 1, wherein a material of the drainage sections (12) consists of a hydrophobic material, and/or a material of the buffer sections (13) consists of a hydrophilic material.

9. The structure for optimizing the process of inkjet printing and packaging in claim 2, wherein a material of the drainage sections (12) consists of a hydrophobic material, and/or a material of the buffer sections (13) consists of a hydrophilic material.

10. The structure for optimizing the process of inkjet printing and packaging in claim 3, wherein a material of the drainage sections (12) consists of a hydrophobic material, and/or a material of the buffer sections (13) consists of a hydrophilic material.

11. The structure for optimizing the process of inkjet printing and packaging in claim 7, wherein a material of the drainage sections (12) consists of a hydrophobic material, and/or a material of the buffer sections (13) consists of a hydrophilic material.

12. A display screen, comprising the structure for optimizing the process of inkjet printing and packaging in claim 1.

13. The display screen in claim 12, wherein the structure further comprises buffer sections (13) that are disposed in the ink filling area and adjacent to the first intervals, and are configured to reduce a flow rate of the ink to the ink filling area during an ink filling process; and a height of each of the buffer sections (13) is less than a height of each of the drainage sections (12), and the height of each of the drainage sections (12) is less than or equal to a height of each of the first shielding sections (11).

14. The display screen in claim 13, wherein there is a one-to-one correspondence between the buffer sections (13) and the first intervals, a width of each of the buffer sections (13) is less than a width of each of the first intervals, and a number of the buffer sections (13) is same as a number of the first intervals.

15. The display screen in claim 12, wherein the structure further comprises at least one second dam (2), the second dam (2) is arranged around outer sides of all of the first dams (1), and a height of the second dam (2) is greater than a height of each of the first dams (1).

16. The display screen in claim 12, wherein a material of the drainage sections (12) consists of a hydrophobic material, and/or a material of the buffer sections (13) consists of a hydrophilic material.

17. A method for optimizing a process of inkjet printing and packaging, comprising a following step:

using a plurality of drainage sections (12) disposed in a vertical direction to guide ink to be added to an ink filling area during an ink filling process;

wherein there are first intervals for allowing the ink to flow in between adjacent drainage sections (12), the plurality of the drainage sections (12) are arranged on an inner wall of first shielding sections (11), and a plurality of sequentially connected first shielding sections (11) constitute first dams (1); and a substrate (3) and the plurality of the sequentially connected first shielding sections (11) surround the ink filling area, and the first dams (1) are arranged around an active display area of the substrate (3).

18. The method for optimizing the process of inkjet printing and packaging in claim 17, wherein the method further comprises a following step:

using buffer sections (13) to reduce a flow rate of the ink to the ink filling area during the ink filling process;

wherein the buffer sections (13) are disposed in the ink filling area and adjacent to the first intervals, a height of each of the buffer sections (13) is less than a height of each of the drainage sections (12), and the height of each of the drainage sections (12) is less than or equal to a height of each of the first shielding sections (11).

19. The method for optimizing the process of inkjet printing and packaging in claim 17, wherein the method further comprises a following step:

using a second dam (2) adjacent to an edge of the active display area to prevent the ink from flowing out of the active display area during the ink filling process.

20. The method for optimizing the process of inkjet printing and packaging in claim 18, wherein the method further comprises a following step:

using a second dam (2) adjacent to an edge of the active display area to prevent the ink from flowing out of the active display area during the ink filling process.

\* \* \* \* \*